United States Patent
Zengerling et al.

(10) Patent No.: US 7,564,636 B2
(45) Date of Patent: Jul. 21, 2009

(54) DEVICE FOR PREVENTING THE DISPLACEMENT OF AN OPTICAL ELEMENT

(75) Inventors: Christian Zengerling, Mühlhausen (DE); Armin Schoeppach, Aalen (DE); Ulrich Weber, Ulm (DE)

(73) Assignee: Carl Zeiss SMT AG (DE)

( * ) Notice: Subject to any disclaimer, the term of this patent is extended or adjusted under 35 U.S.C. 154(b) by 64 days.

(21) Appl. No.: 10/570,021

(22) PCT Filed: Aug. 20, 2004

(86) PCT No.: PCT/EP2004/009326

§ 371 (c)(1),
(2), (4) Date: Apr. 12, 2007

(87) PCT Pub. No.: WO2005/022231

PCT Pub. Date: Mar. 10, 2005

(65) Prior Publication Data

US 2007/0183063 A1    Aug. 9, 2007

(30) Foreign Application Priority Data

Aug. 27, 2003    (DE) ................. 103 39 362

(51) Int. Cl.
*G02B 7/02* (2006.01)
(52) U.S. Cl. ............... 359/811; 359/813; 359/818
(58) Field of Classification Search ........... 359/811, 359/813, 818, 819, 827, 829, 830
See application file for complete search history.

(56) References Cited

U.S. PATENT DOCUMENTS

| 4,733,945 | A | 3/1988 | Bacich |
| 6,392,825 | B1 | 5/2002 | Trunz et al. |
| 6,473,247 | B1 * | 10/2002 | Keller et al. ............... 359/819 |
| 6,556,364 | B2 | 4/2003 | Meehan et al. |
| 6,580,570 | B2 | 6/2003 | Becker et al. |

FOREIGN PATENT DOCUMENTS

| DE | 197 35 760 A1 | 2/1999 |
| DE | 100 51 706 A1 | 5/2002 |
| DE | 102 11 791 A1 | 10/2003 |
| EP | 1 026 532 A1 | 8/2000 |
| EP | 1 376 183 A2 | 2/2004 |
| JP | 62239115 | 10/1987 |
| JP | 2003172857 | 10/1987 |

OTHER PUBLICATIONS

Lateral Support Of Very large Telescope Mirrors By Edge Forces Only (13 pages), Journal of Modern Optics 1988 by G. Schwesinger.
New Photolithography Stepping Machine (35 pages), Mar. 8, 1995 by Layton Hale, Jeff Klingmann, David Markle.

* cited by examiner

*Primary Examiner*—Timothy J Thompson
(74) *Attorney, Agent, or Firm*—GrayRobinson, P.A.

(57) ABSTRACT

In a device for preventing the creeping of an optical element, in particular a lens or a mirror, the optical element is connected to a mount via connecting members arranged on the circumference of the optical element. The position of the optical element in an objective (PL) deviates from the vertical axial position. In order to compensate the dead weight at least of the optical element at least one holding element via which the optical element is held on a housing part of the objective (PL) is provided in addition to the connecting members.

34 Claims, 2 Drawing Sheets

DEVICE FOR PREVENTING THE DISPLACEMENT OF AN OPTICAL ELEMENT

CROSS REFERENCE TO RELATED APPLICATIONS

This is a U.S. National Phase entry under 35 U.S.C. § 371 of International Application No. PCT/EP2004/009326 filed Aug. 20, 2004 which designated the U.S. and at least one other country in addition to the U.S. and which claimed priority to German Patent Application No. 103 39 362.5 filed Aug. 27, 2003.

BACKGROUND OF THE INVENTION

The invention relates to a device for preventing the creeping of an optical element, in particular a lens or a mirror, the optical element being connected to a mount via connecting members arranged on the circumference of the optical element, and the position of the optical element in an objective deviating from the vertical axial position.

To date, in semiconductor lithography, optical elements have been held in a mount by means of various clamping techniques, clamping in combination with self-closure and via bonded connections, for example by gluing. It is generally known that in the case of screwed connections it is necessary to shape the screws so as to keep the elasticity of the screw shank as low as possible in order to keep within a tolerable range the loss of prestressing force owing to setting and relaxation effects of the shaft. Elements of high elasticity are used with clamped connections or mechanical coupling points in order to thus minimize the effects of tolerances during installation, and to minimize temporal changes acting during operation on the parts that determine functioning.

It is also known from the older DE 102 11 791.8 that in conjunction with a vertical optical axis the optical element is glued onto elastic connecting members or spring elements. Before the optical element is glued in, it is laid onto the elastic connecting members, and the optical axis of the optical element is aligned parallel to the mount axis. In this case, gravity acts approximately along the optical axis of the optical element. The optical element can then be connected or glued to the elastic connecting members.

It is possible for a mount to be arranged in projection objectives together with the optical element such that the optical axis of the optical element is horizontal or is inclined at a specific angle to the vertical. As a result, gravity acts not only along the optical axis of the optical element, but also transverse thereto. Because of the bearing of the optical element on the elastic connecting members, the effect of gravity acting transverse to the optical axis is generally a displacement of the optical axis of the optical element transverse to the mount axis and, possibly, a tilting of the optical axis of the optical element in relation to the mount axis. The elastic connecting members are deformed by the weight force, acting transverse to the optical axis, of the optical element in such a way that the optical element is displaced in the lateral direction in relation to its original position and is tilted.

A lateral displacement of the optical element can be corrected during installation in the projection objective by means of an appropriate displacement of the mount, no tilting correction being possible by displacing the mount during installation of the objective. As is known, for example, from Stuart. T-Smith: Flexures; Gordon and Breach Science Publishers, 2000, it is possible to use the customary methods of elasticity theory in order to shape and design the elastic connecting members such that they lead not to a tilting of the optical element, but only to a lateral displacement in the event of loading by the force of gravity on the optical element transverse to the optical axis. The position of the centroid of the optical element plays an important role in the design of the elastic connecting members to counteract tilting of the optical element. The sectional loads, resulting in the event of lateral offset of the optical element without tilting, of the elastic connecting members between connecting members and optical element should, when combined as resulting force, form a force through the centroid of the optical element that is of the same magnitude as gravity and acts against it. Since, however, the elasticity of the connecting members can fluctuate owing to manufacturing tolerances, a displacement of the resulting force, and thus an impossibly large tilting of the optical element can occur despite a theoretically correct design of the connecting members counter to tilting. The abovementioned correction of the lateral offset is, however, possible only when the offset does not change with time. In a preferred fastening of the optical element by means of gluing, however, it is possible for the glue to creep as a consequence of shear stresses, and thus, again, for there to be a temporally variable lateral offset.

It is likewise known from the older DE 102 11 791.8 for there to be inserted between the elastic connecting members and the optical element inserts such as, for example, angles or wedges, that provide additional gluing points between the optical element and the connecting members via suitable connections. Even by thus lowering the glue stress and raising the stability, the load changes caused by relaxation, setting and creep phenomena of the optical element at the connecting points cannot fundamentally be reduced. The inserts only put off the problem. Likewise, no glues free from creep are yet known.

Lateral bearings for the optical element via two "half" bearings are likewise known from Paul R. Yoder: Design and Mounting of Precision and Small Mirrors in Optical Instruments, Spie Volume TT32, page 154. With any type of fastening, for example screwing an optical element on or gluing it, large local defects arise here in the region of the fastening points of the optical element. However, as is known from U.S. Pat. No. 4,733,945, a simple mounting technique is not possible by spherization.

It is likewise known from investigations relating to lateral bearing of large mirrors to permit the lateral bearings to act tangentially or at a specific angle to the tangent, and thereby to minimize the bending of the optical element as far as possible. Such investigations are described in the Journal of modern Optics, 1988, by Schwesinger, G.: Lateral support of very large telescope mirrors by edge forces only. If the tangential bearings are glued onto the optical element, the lens likewise creeps through being acted upon by gravity.

Fastening the optical element by soldering, as is known from DE 197 35 760 A1, produces no advantageous improvement, since the optical element is distorted or warped when experiencing thermal expansion. Fastening by clamping produces local stresses and requires a larger optically unused overflow of the optical element.

Again, active bearings known, for example, from DE 100 51 706 A1, such as readjusting the creeping movement of the optical element with the aid of an XY manipulator and/or a tilt manipulator constitute only unsatisfactory solutions. It is true that the rigid body movement would be compensated in the case of such solutions, but not so the deformations, produced by stress redistribution at the gluing points, of the optical element. Moreover, such bearings require a complicated design that entails high costs and requires electronic control.

Reference may be made to Hale, L. et al.: New photolithography stepping machine, Lawrence Livermore National Laboratory, 1995, UCRL-ID-120313, page 4 ff. and page 25 for the further prior art.

It is therefore an object of the invention to provide a device for preventing creeping of optical elements arranged and glued in mounts, optical axes of the optical elements not being vertical.

BRIEF SUMMARY OF THE INVENTION

The object is achieved according to the invention by virtue of the fact that in order to compensate the dead weight at least of the optical element at least one holding element is provided, at least one holding element advantageously being designed as a soft spring element, via which the optical element is held on a housing part of the objective.

The optical element that is connected by gluing to a mount via connecting members has at least one holding element for dead weight compensation or for compensating the tilting error. Creeping can now be prevented by virtue of the fact that the dead weight of the optical element is absorbed by the at least one holding element, which can be designed as a soft, prestressed spring element. The prestressing force of the spring element should correspond in this case to the weight force of the optical element. It is possible with the aid of such a device for the gluing points between the connecting members and the optical element to be virtually unstressed with regard to the shear stress that triggers creeping.

In an advantageous refinement of the invention, it is provided that the at least one holding element is designed as a pneumatic spring element that is connected to the optical element.

According to the invention, the holding element can also be designed as a pneumatic spring element, and this permits a very simple variation of the spring stiffness of the spring element by means of a gas accumulator located at another point. It can also be provided here that the supporting forces can be distributed, and that the deformation of the optical element as a consequence of spring forces is thereby minimized.

In a refinement of the invention according to the invention, it is further provided that the action line of the resulting force of the spring elements can be displaced by an adjusting mechanism to the centroid of the optical element.

When use is made of an adjusting mechanism with the aid of which the action line of the resulting force from the spring elements or weight compensation spring elements can be displaced, the action line can be displaced in such a way that a torque opposing the tilting can be transmitted about the centroid of the optical element in order thus to compensate an impossibly large tilting of the optical element.

Exemplary embodiments of the invention are explained below in more detail with the aid of the drawings, in which:

DETAILED DESCRIPTION OF PREFERRED EMBODIMENTS

Figure 1:
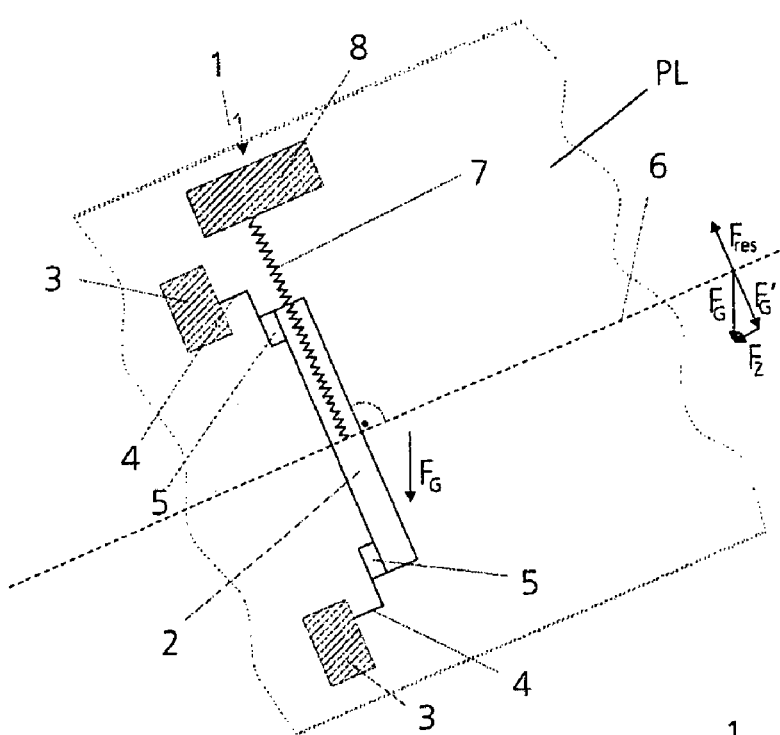
FIG. 1 shows a schematic of the device according to the invention in conjunction with an optical element.

FIG. 1 shows a device 1 in a projection objective PL, illustrated schematically and in part, for semiconductor lithography, the device 1 being illustrated in conjunction with an optical element 2, in particular a lens or a mirror. The optical element 2, whose position deviates from a vertical axial position, is connected to a mount 3 via connecting members 4 arranged on the circumference of the optical element 2. The optical element 2 is connected to the connecting members 4 via cement 5. The optical element 2 is borne as given the presence of a vertical optical axis, forces in the direction of an optical axis 6 of the optical element 2 being absorbed, as previously. The device 1 has holding elements 7 that are connected in each case tangentially to the optical element 2 at their opposite end points.

Because of the illustration in side view, only one holding element 7 is shown in FIG. 1, the second holding element 7 being covered by the first holding element 7. The holding elements 7 are designed as soft prestressed spring elements. The prestressing of the spring elements 7 corresponds in this case to the dead weight of the optical element 2. This produces a bearing that is insensitive to small displacements of the fastening points of the spring element 7 on the optical element 2. The fastening points (end points) or the gluing points 5 are virtually unstressed with regard to the shear stress that triggers creeping, because the spring elements 7 compensate the dead weight of the optical element 2. If the fastening point for the soft spring element 7 is glued on the optical element 2, creeping is not dangerous here, since this would change the prestressing force of the spring element 7 only insubstantially. Since the soft spring elements 7 absorb the weight of the optical element 2, something which gives rise to geometric variations in the course of time during the use of the projection objective PL such as, for example, setting or creeping, owing to their softness, however, these cause no changes in load at the optical element 2 that can cause deformations or rigid body movements.

The action of force, the direction of force and the magnitude force of the spring elements 7 can be optimized such that the influence on the lens or mirror deformation is very slight. Such solutions are already known from the prior art and can, for example, be taken from the theory of Schwesinger, G. (1954): Optical Effect of Flexure in Vertically Mounted Precision Mirrors, f. Opt. Soc. Am 44:417. Furthermore, the adjustment of the forces in magnitude and direction can be performed by control elements 8 such as, for example, adjusting screws, piezoelectric, electromagnetic or pneumatic drives. These serve adjusting purposes in setting the deformation of the optical element 2. The weight force is illustrated in FIG. 1 by an arrow with the reference symbol $F_G$.

Figure 2:
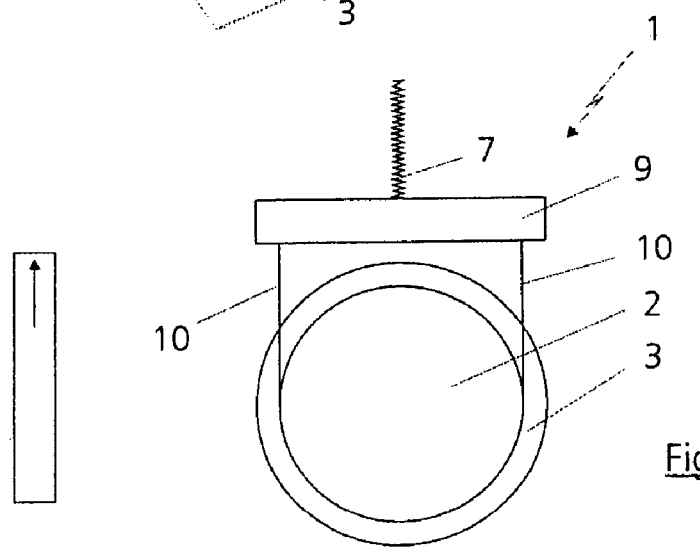
FIG. 2 shows a schematic of a possibility for configuring the device according to the invention.

FIG. 2 shows a further design refinement of the device 1, only one holding element 7, which is likewise designed as a spring element, being provided in this refinement. The spring element 7 is connected to the optical element 2 in this case with the aid of a connecting element 9 via fastening elements 10 that, just like the spring elements 7 in accordance with FIG. 1, act tangentially at opposite sides on the optical element 2. When the optical axis 6 runs in a horizontal direction, this means that the spring element 7 or fastening elements 10 act laterally in the horizontal plane. The fastening elements 10 can be designed as strips, wires or cables that can, in turn, be glued or else screwed onto the optical element 2. The action line through the centroid of the optical element 2 is illustrated in FIG. 2 on the side next to the illustration of the device 1. It is thereby possible here, as well, to prevent creeping of the optical element 2 by virtue of the fact that the dead weight of the optical element 2 is absorbed by the fastening elements 10 and the soft spring element 7.

Figure 3:
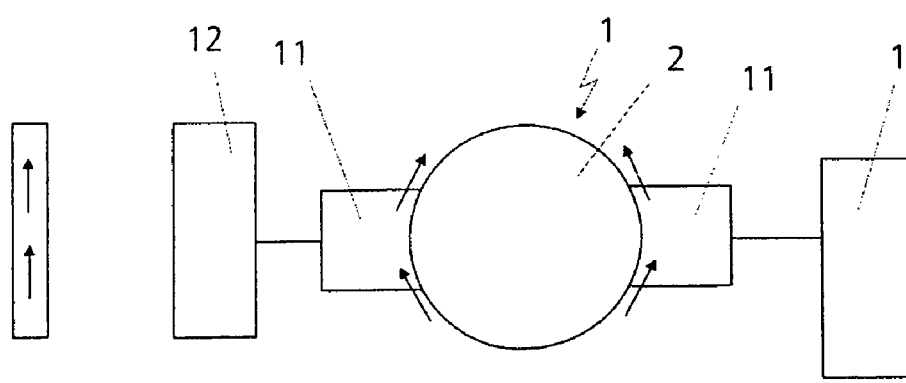
FIG. 3 shows a schematic illustration of a further alternative possibility for configuring the device.

A further alternative possibility for the device 1 is illustrated in FIG. 3. In use here as holding elements are pneumatic spring elements 11 that introduce a force into the optical element 2 in the direction indicated by arrows. The pneumatic spring elements 11 act on opposite sides of the optical element 2 and each have a piston element that acts on the optical element 2. The pneumatic spring elements 11 have the same pressure, the spring elements 11 being connected to a gas container 12 that provides a constant pressure. It is important here that the pressure is to be selected or can be selected or set such that the dead weight of the optical element 2 is compensated. The gas container 12 renders it possible to vary the spring stiffness of the spring elements 11 easily. The action line through the centroid of the optical element 2 is likewise specified to the side of the device 1 in FIG. 3. In the case of a pneumatic solution, the supporting forces can be distributed over a larger surface, as already illustrated in FIG. 3, and the deformation of the optical element 2 as a consequence of the spring forces is thereby minimized. There is thus a uniform force distribution.

Figure 4A:
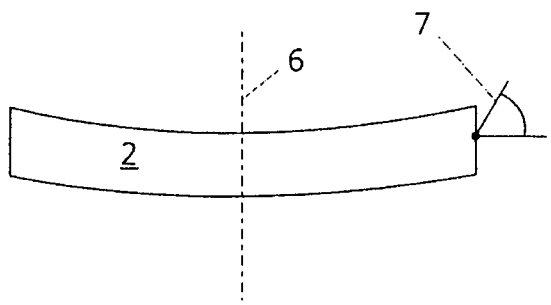
FIGS. 4a and 4b show an illustration of a possible variant of the fitting of holding elements to the optical element, and of the force distribution.

FIG. 4 illustrates a possible variant of the fitting of the holding elements 7 or of the fastening elements 10 on the optical element 2. In accordance with FIGS. 1 and 2, the holding elements 7 or the fastening elements 10 are fitted on the optical element 2 in such a way that the holding elements 7 or the fastening elements 10 are fitted on the optical element 2 in a fashion perpendicular to the optical axis 6 of the optical element 2, and precisely counteract a force $F_G'$ that, together with a force $F_Z$, produces the weight force $F_G$. As previously, the force $F_Z$ is compensated by means of the connecting members 4 or is absorbed by them. However, as illustrated in FIG. 4a, it is also possible to fit the holding elements 7 or the fastening elements 10 on the optical element 2 at a specific angle $\alpha$ to an axis that is orthogonal to the optical axis 6.

Figure 4B:
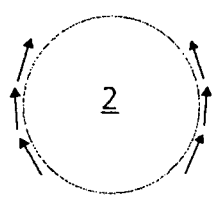

The force distribution is sketched in FIG. 4b in a plan view onto the optical element 2, it also being possible for the forces to be inclined to the plane of the drawing.

The fitting of spring elements, specifically the pneumatic spring elements 11, and their activation are performed after the mounting and adjustment, carried out in the usual way, of the optical element 2. Owing to the soft spring elements 7 and 11, there are no critical mounting tolerances for the fastening of the spring elements 7 or 11 on the optical element 2.

A lateral displacement of the optical element 2 is virtually prevented by the device 1 in the projection objective PL illustrated in FIG. 1, it being impossible, however, to compensate tilting of the optical axis 6 of the optical element 2 with the aid of a device 1 according to FIG. 1.

Force should act on the holding elements 7 as far as possible in such a way that it is also impossible for the optical axis 6 of the optical element 2 to be tilted in relation to a mount axis of the mount 3.

Since the elasticity of the connecting members 4 can fluctuate owing to manufacturing tolerances or else material inhomogeneities, it is possible for there to be an impermissibly large tilting of the optical element 2 in relation to the mount 3 despite the correct design of the connecting members 4 against tilting.

Likewise, a tilting moment or a torque occurs when the force does not act on the holding elements or spring elements 7 or the fastening element 10 at the centroid 13 of the optical element.

Figure 5A:
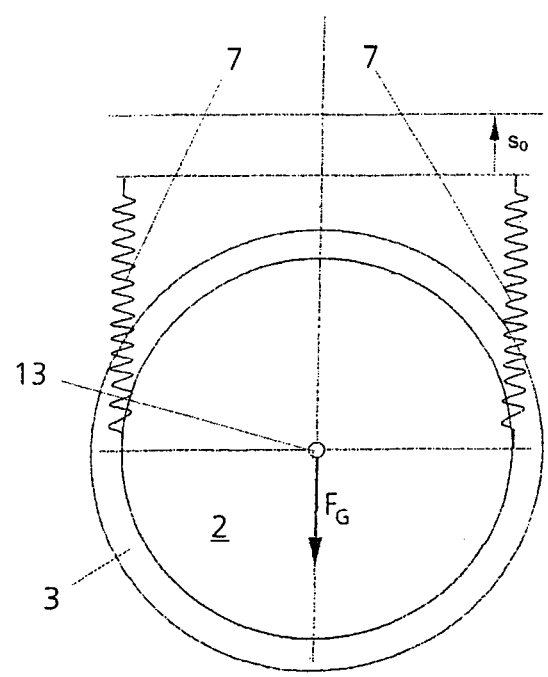
FIGS. 5a and 5b show a schematic of an adjusting mechanism for displacing the action line of the resulting force of the holding elements, the plan view being illustrated in FIG. 5a, and the side view in FIG. 5b.
Figure 5B:
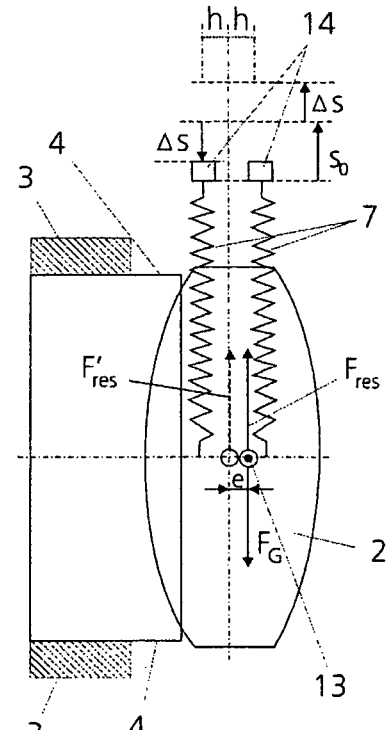

FIGS. 5a and 5b illustrate a measure by means of which it is possible to apply or displace the resulting force of two spring elements 7 such that the resulting force $F_{res}$ acts at the centroid 13.

Two pairs of spring elements 7 are provided in accordance with this exemplary embodiment, the optical element 2 being respectively connected laterally to a pair of spring elements 7. Each pair of spring elements 7 is prestressed by a distance so such that the resulting force $F_{res}$ of the spring element pair 7, which is transmitted to the optical element 2, can have its magnitude set such that it compensates the weight force of the optical element 2. If all the springs are designed identically with reference to the spring force, and the prestress applied is also equal, the resulting force $F_{res}$, which acts at the centroid 13, is half the weight force on each side of the optical element 2. Consequently, the resulting force $F_{res}'$ runs respectively in the middle between the spring elements 7 on each side, as is illustrated by dashes. A tilting moment or a torque would be produced if the centroid 13 is not located ideally on the action line of $F_{res}'$ but, as illustrated, is offset by a spacing e in the direction of a spring element 7. In order to avoid this, the action line of the resulting force $F_{res}'$ must be displaced to the centroid 13, where it then counter-acts the weight force $F_G$ as $F_{res}$ with the same magnitude.

The displacement of the action lines of the resulting force $F_{res}'$ to the centroid 13 is achieved by virtue of the fact that independently of the other spring element 7 of a spring element pair one spring element 7 of the spring element pair is more strongly stressed by a stressing device 14 (shown only schematically) as adjusting mechanism by the distance $\Delta s$ with the aid of a force, and the other spring element 7 is relieved by a force of equal magnitude. It is to be borne in mind here that $F_{res}$ continues to correspond in total from both sides to the weight force $F_G$ in order to achieve the desired compensation of the weight force and—in accordance with this exemplary embodiment—also to avoid tilting.

For a pair of spring elements 7 that is prestressed by the distance so and of which one spring element 7 is now additionally stressed by the path $\Delta s$ while the other spring element 7 is relieved by the distance $\Delta s$, the magnitude of the resulting force $F_{res}$ is yielded from the following equation, the spring constant c for the spring elements 7 of a pair being required to be of equal magnitude in each case:

$$F_{res} = c(s_0 + \Delta s) + c(s_0 - \Delta s) = 2cs_0.$$

The spacing e of the centroid 13 from $F_{res}'$, that is to say the central line between the two springs is calculated using the following formula:

$$e = h \cdot \Delta s / s_0$$

h respectively being the spacing of a spring element 7 from the central line between the two spring elements 7.

In one design of the device 1 having the adjusting mechanism illustrated in FIGS. 5a and 5b, the device 1 is therefore designed simultaneously as a tilt and weight compensator in order thus to prevent creeping and tilting of the optical element 2 during installation and when being operated in the projection objective PL.

We claim:

1. A device for connecting an optical element to a mount of an objective of the type having a housing part, said device comprising:

at least one spring element via which the optical element is coupled to the housing part of the objective; and, at least one connecting member arranged peripherally of the optical element, the optical element being coupled to the mount via the at least one connecting member and a glued connection, the optical element having a mount axis which is inclined at an angle to the direction of a weight force representing the dead weight of at least the optical element, the at least one spring element and the at least one connecting member acting to compensate the weight force to mitigate creeping associated with the glued connection.

2. A device for connecting an optical element to a mount of an objective, said device, comprising: connecting members arranged on the circumference of the optical element, the optical element being connected to the mount via the connecting members, the mount axis of the optical element being inclined at an angle to the direction of the weight force, and wherein, in order to compensate the weight force of the optical element, at least one spring element via which the optical element is held on the housing part is provided in addition to the connecting members, and wherein, the optical element is held on the housing part of the objective by the at least one spring element on the side averted from the direction of the weight force.

3. The device as claimed in claim 1, wherein in addition to compensating the dead weight, the at least one spring element is also provided for compensating a tilting error.

4. A device for connecting an optical element to a mount of an objective, said device, comprising: connecting members arranged on the circumference of the optical element, the optical element being connected to the mount via the connecting members, the mount axis of the optical element being inclined at an angle to the direction of the weight force, and wherein, in order to compensate the weight force of the optical element, at least one spring element via which the optical element is held on the housing part is provided in addition to the connecting members and wherein, the spring element is biased, the bias corresponding at least approximately to the dead weight of the optical element.

5. A device for connecting an optical element to a mount of an objective, said device, comprising: connecting members arranged on the circumference of the optical element, the optical element being connected to the mount via the connecting members, the mount axis of the optical element being inclined at an angle to the direction of the weight force, and wherein, in order to compensate the weight force of the optical element, at least one spring element via which the optical element is held on the housing part is provided in addition to the connecting members, and wherein two springs are provided that are respectively connected tangentially at their end points to the optical element.

6. The device as claimed in claim 5 wherein the end points of the spring elements are connected to the optical element by way of a glued connection.

7. A device for connecting an optical element to a mount of an objective, said device, comprising: connecting members arranged on the circumference of the optical element, the optical element being connected to the mount via the connecting members, the mount axis of the optical element being inclined at an angle to the direction of the weight force, and wherein, in order to compensate the weight force of the optical element, at least one spring element via which the optical element is held on the housing part is provided in addition to the connecting members and wherein a central spring element is provided that is connected to a connecting element on which fastening elements that act tangentially on the optical element are arranged.

8. A device for connecting an optical element to a mount of an objective, said device, comprising: connecting members arranged on the circumference of the optical element, the optical element being connected to the mount via the connecting members, the mount axis of the optical element being inclined at an angle to the direction of the weight force, and wherein, in order to compensate the weight force of the optical element, at least one spring element via which the optical element is held on the housing part is provided in addition to the connecting members, and wherein the at least one spring element comprises a pneumatic spring element that is connected to the optical element.

9. The device as claimed in claim 1 wherein the at least one spring element is arranged on the optical element in a fashion perpendicular to an optical axis of the optical element.

10. A device for connecting an optical element to a mount of an objective, said device, comprising:
    connecting members arranged on the circumference of the optical element, the optical element being connected to the mount via the connecting members, the mount axis of the optical element being inclined at an angle to the direction of the weight force, and wherein, in order to compensate the weight force of the optical element, at least one spring element via which the optical element is held on the housing part is provided in addition to the connecting members, and wherein the at least one spring element can be adjusted via at least one control element.

11. A device for connecting an optical element to a mount of an objective, said device, comprising: connecting members arranged on the circumference of the optical element, the optical element being connected to the mount via the connecting members, the mount axis of the optical element being inclined at an angle to the direction of the weight force, and wherein, in order to compensate the weight force of the optical element, at least one spring element via which the optical element is held on the housing part is provided in addition to the connecting members wherein a number of spring elements are arranged such that an action line of the resulting force runs through a centroid of the optical element.

12. The device as claimed in claim 11 wherein an adjusting mechanism is provided by means of which the action line of the resulting force of the spring elements can be displaced to the centroid of the optical element.

13. The device as claimed in claim 12 wherein the adjusting mechanism comprises two pairs of spring elements, each spring element acting on the optical element at a distance from the centroid of the optical element, and it being possible to adjust the spring elements individually by the adjusting mechanism.

14. A projection objective for semiconductor lithography, the projection objective being of the type having a housing part, the projection objective comprising:
    at least one optical element whose position deviates from a vertical axial position; at least one holding element via which the optical element is connected to the housing part; and, connecting members arranged peripherally of the optical element, the optical element being coupled to the mount via the at least one connecting member and a glued connection, the at least one holding element and the at least one connecting member acting to compensate a weight force representing the dead weight of at least the optical element.

15. A projection objective for semiconductor lithography comprising:

at least one optical element, the optical element being connected to a mount via connecting members arranged on the circumference of the optical element, and the position of the optical element deviating from the vertical axial position, and wherein, in order to compensate the dead weight at least of the optical element, at least one holding element via which the optical element is held on a housing part is provided in addition to the connecting members, and wherein the optical element is held on the housing part by the at least one holding element on the side averted from the direction of the weight force.

16. A projection objective for semiconductor lithography comprising:
at least one optical element, the optical element being connected to a mount via connecting members arranged on the circumference of the optical element, and the position of the optical element deviating from the vertical axial position, and wherein, in order to compensate the dead weight at least of the optical element, at least one holding element via which the optical element is held on a housing part is provided in addition to the connecting members, and wherein, in addition to being provided for compensating the dead weight, the at least one holding element is also provided for compensating tilting error.

17. The projection objective as claimed in claim 14 wherein the at least one holding element comprises a spring element whose spring force producing essentially no change in position of the optical element during creeping of the optical element.

18. The projection objective as claimed in claim 16 wherein two spring elements are provided that are respectively connected tangentially at their end points to the optical element.

19. A projection objective for semiconductor lithography comprising:
at least one optical element, the optical element being connected to a mount via connecting members arranged on the circumference of the optical element, and the position of the optical element deviating from the vertical axial position, and wherein, in order to compensate the dead weight at least of the optical element, at least one holding element via which the optical element is held on a housing part is provided in addition to the connecting members, and wherein the at least one holding element comprises a pneumatic spring element that is connected to the optical element.

20. A projection objective for semiconductor lithography comprising:
at least one optical element, the optical element being connected to a mount via connecting members arranged on the circumference of the optical element, and the position of the optical element deviating from the vertical axial position, and wherein, in order to compensate the dead weight at least of the optical element, at least one holding element via which the optical element is held on a housing part is provided in addition to the connecting members, and wherein, the at least one holding element is arranged on the optical element in a fashion perpendicular to an optical axis of the optical element.

21. A device for connecting an optical element to a mount of an objective having a housing part, said device comprising:
an optical element; connecting members arranged about the periphery of the optical element, the optical element being connected to the mount via the connecting members and a glued connection, the optical element having a mount axis which is inclined at an angle to the direction of a weight force representing the dead weight of at least the optical element, and wherein, in order to compensate the weight force of the optical element, in addition to the connecting members, the device further comprises at least one holding element via which the optical element is coupled to the housing part of the objective, the holding element exerting an approximately constant force on the optical element notwithstanding small deflections of the optical element.

22. A device for connecting an optical element to a mount of an objective, said device comprising:
connecting members arranged on the circumference of the optical element, the optical element being connected to the mount via the connecting members, the mount axis of the optical element being inclined at an angle to the direction of the weight force of the optical element, and wherein, in order to compensate the weight force of the optical element, the device further comprises, in addition to the connecting members, at least one holding element via which the optical element is held on a housing part of the objective, wherein the force exerted on the optical element by the holding element remains approximately constant in the event of small deflections of the optical element and wherein the optical element is held on the housing part of the objective by the at least one holding element on the side averted from the direction of the weight force.

23. The device as claimed in claim 22 wherein, in addition to being provided for compensating the dead weight, the at least one holding element is also provided for compensating a tilting error.

24. The device as claimed in claim 22 wherein the at least one holding element comprises at least one spring element whose spring force produces essentially no change in position of the optical element during creeping of the optical element.

25. A device for connecting an optical element to a mount of an objective, said device comprising:
connecting members arranged on the circumference of the optical element, the optical element being connected to the mount via the connecting members, the mount axis of the optical element being inclined at an angle to the direction of the weight force of the optical element, and wherein, in order to compensate the weight force of the optical element, the device further comprises, in addition to the connecting members, at least one holding element via which the optical element is held on a housing part of the objective, and wherein the force exerted on the optical element by the holding element remains approximately constant in the event of small deflections of the optical element, and wherein the spring element is biased according to a bias which at least approximately corresponds to the dead weight of the optical element, and wherein the at least one holding element comprises at least one spring element whose spring force produces essentially no change in position of the optical element during creeping of the optical element.

26. A device for connecting an optical element to a mount of an objective, said device comprising: connecting members arranged on the circumference of the optical element, the optical element being connected to the mount via the connecting members, the mount axis of the optical element being inclined at an angle to the direction of the weight force of the optical element, and wherein, in order to compensate the weight force of the optical element, the device further comprises, in addition to the connecting members, at least one holding element via which the optical element is held on a housing part of the objective, and wherein the force exerted on the optical element by the holding element remains approximately constant in the event of small deflections of the optical element, wherein the at least one holding element comprises two spring elements that are respectively connected tangentially at their end points to the optical element, the spring force of the two spring elements producing essentially no change in position of the optical element during creeping of the optical element.

27. The device as claimed in claim 26 wherein the end points of the spring elements are connected to the optical element by gluing.

28. A device for connecting an optical element to a mount of an objective, said device comprising:

connecting members arranged on the circumference of the optical element, the optical element being connected to the mount via the connecting members, the mount axis of the optical element being inclined at an angle to the direction of the weight force of the optical element, and wherein, in order to compensate the weight force of the optical element, the device further comprises, in addition to the connecting members, at least one holding element via which the optical element is held on a housing part of the objective, and wherein the force exerted on the optical element by the holding element remains approximately constant in the event of small deflections of the optical element, the at least one holding element comprising a spring element whose spring force produces essentially no change in position of the optical element during creeping of the optical element, said spring element comprising a central spring element that is connected to a connecting element on which fastening elements that act tangentially on the optical element are arranged.

29. A device for connecting an optical element to a mount of an objective, said device comprising:

connecting members arranged on the circumference of the optical element, the optical element being connected to the mount via the connecting members, the mount axis of the optical element being inclined at an angle to the direction of the weight force of the optical element, and wherein, in order to compensate the weight force of the optical element, the device further comprises, in addition to the connecting members, at least one holding element via which the optical element is held on a housing part of the objective, and wherein the force exerted on the optical element by the holding element remains approximately constant in the event of small deflections of the optical element, the at least one holding element comprising at least one spring element whose spring force produces essentially no change in position of the optical element during creeping of the optical element, the at least one spring element comprising a pneumatic spring element that is connected to the optical element.

30. The device as claimed in claim 21 wherein the at least one holding element is arranged on the optical element in a fashion perpendicular to an optical axis of the optical element.

31. A device for connecting an optical element to a mount of an objective, said device comprising:

connecting members arranged on the circumference of the optical element, the optical element being connected to the mount via the connecting members, the mount axis of the optical element being inclined at an angle to the direction of the weight force of the optical element, and wherein, in order to compensate the weight force of the optical element, the device further comprises, in addition to the connecting members, at least one holding element via which the optical element is held on a housing part of the objective, and wherein the force exerted on the optical element by the holding element remains approximately constant in the event of small deflections of the optical element, and wherein the at least one holding element can be adjusted via at least one control element.

32. A device for connecting an optical element to a mount of an objective, said device comprising: connecting members arranged on the circumference of the optical element, the optical element being connected to the mount via the connecting members, the mount axis of the optical element being inclined at an angle to the direction of the weight force of the optical element, and wherein, in order to compensate the weight force of the dead weight of the optical element, the device further comprises, in addition to the connecting members, at least one holding element via which the optical element is held on a housing part of the objective, the force exerted on the optical element by the holding element remaining approximately constant in the event of small deflections of the optical element, and wherein, in addition to being provided for compensating for the dead weight, the at least one holding element is also provided for compensating a tilting error, the at least one holding element comprising a number of holding elements arranged such that an action line of the resulting force runs through a centroid of the optical element.

33. The device as claimed in claim 32 further comprising an adjusting mechanism by means of which the action line of the resulting force of the holding elements can be displaced to the centroid of the optical element.

34. The device as claimed in claim 33 wherein the adjusting mechanism has two pairs of holding elements, each holding element acting on the optical element at a distance from the centroid of the optical element, and it being possible to adjust the holding elements individually by the adjusting mechanism.

* * * * *

UNITED STATES PATENT AND TRADEMARK OFFICE
CERTIFICATE OF CORRECTION

PATENT NO. : 7,564,636 B2  Page 1 of 1
APPLICATION NO. : 10/570021
DATED : July 21, 2009
INVENTOR(S) : Christian Zengerling et al.

It is certified that error appears in the above-identified patent and that said Letters Patent is hereby corrected as shown below:

Column 6, line 12:
 delete "so" and replace with -- $S_0$ --

Column 6, line 42:
 delete "so" and replace with -- $S_0$ --

Signed and Sealed this

Twenty-sixth Day of January, 2010

David J. Kappos
*Director of the United States Patent and Trademark Office*